(12) United States Patent
Honda et al.

(10) Patent No.: US 9,123,734 B2
(45) Date of Patent: Sep. 1, 2015

(54) SEMICONDUCTOR-ENCAPSULATING ADHESIVE, SEMICONDUCTOR-ENCAPSULATING FILM-FORM ADHESIVE, METHOD FOR PRODUCING SEMICONDUCTOR DEVICE, AND SEMICONDUCTOR DEVICE

(71) Applicant: HITACHI CHEMICAL COMPANY, LTD., Tokyo (JP)

(72) Inventors: Kazutaka Honda, Ibaraki (JP); Tetsuya Enomoto, Ibaraki (JP); Yuuki Nakamura, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 14/168,628

(22) Filed: Jan. 30, 2014

(65) Prior Publication Data

US 2014/0206148 A1    Jul. 24, 2014

Related U.S. Application Data

(62) Division of application No. 12/838,291, filed on Jul. 16, 2010, now Pat. No. 8,674,502.

(51) Int. Cl.
*H01L 21/00* (2006.01)
*H01L 21/56* (2006.01)
(Continued)

(52) U.S. Cl.
CPC ............ *H01L 21/563* (2013.01); *C08G 59/42* (2013.01); *C09J 163/00* (2013.01); *C09J 163/04* (2013.01); *C09J 179/08* (2013.01); *H01L 23/293* (2013.01); *H01L 24/29* (2013.01); *H01L 24/73* (2013.01); *H01L 24/81* (2013.01); *H01L 24/83* (2013.01); *H01L 2224/13144* (2013.01); *H01L 2224/13155* (2013.01); *H01L 2224/16225* (2013.01); *H01L 2224/2919* (2013.01);
(Continued)

(58) Field of Classification Search
CPC ..... H01L 21/563; H01L 23/293; H01L 24/29; H01L 24/73; H01L 24/81; H01L 24/83; H01L 2924/0665
USPC ................... 257/737, 788, 792; 438/26, 127
See application file for complete search history.

(56) References Cited

U.S. PATENT DOCUMENTS 6,841,415 B2 * 1/2005 Suzuki et al. ................. 438/106
8,039,305 B2   10/2011 Mejima et al.
(Continued)

FOREIGN PATENT DOCUMENTS

JP    04-050256 A    2/1992
JP    05-320610 A    12/1993
(Continued)

OTHER PUBLICATIONS

Office Action issued in related Japanese application P2008-262100 on Oct. 16, 2012 (no translation available).

*Primary Examiner* — Nicholas Tobergte
(74) *Attorney, Agent, or Firm* — Griffin & Szipl, P.C.

(57) ABSTRACT

The present invention relates to a semiconductor-encapsulating adhesive, a semiconductor-encapsulating film-form adhesive, a method for producing a semiconductor device, and a semiconductor device. The present invention provides a semiconductor-encapsulating adhesive comprising (a) an epoxy resin, and (b) a compound formed of an organic acid reactive with an epoxy resin and a curing accelerator.

11 Claims, 5 Drawing Sheets

(51) Int. Cl.
*C09J 163/04* (2006.01)
*C09J 179/08* (2006.01)
*H01L 23/29* (2006.01)
*H01L 23/00* (2006.01)
*C08G 59/42* (2006.01)
*C09J 163/00* (2006.01)

(52) U.S. Cl.
CPC .......... *H01L 2224/2929* (2013.01); *H01L 2224/29101* (2013.01); *H01L 2224/29386* (2013.01); *H01L 2224/29388* (2013.01); *H01L 2224/29393* (2013.01); *H01L 2224/73104* (2013.01); *H01L 2224/73204* (2013.01); *H01L 2224/81191* (2013.01); *H01L 2224/81201* (2013.01); *H01L 2224/81411* (2013.01); *H01L 2224/81444* (2013.01); *H01L 2224/81455* (2013.01); *H01L 2224/81805* (2013.01); *H01L 2224/81903* (2013.01); *H01L 2224/83191* (2013.01); *H01L 2224/83192* (2013.01); *H01L 2224/94* (2013.01); *H01L 2924/00013* (2013.01); *H01L 2924/0102* (2013.01); *H01L 2924/0103* (2013.01); *H01L 2924/014* (2013.01); *H01L 2924/0105* (2013.01); *H01L 2924/01005* (2013.01); *H01L 2924/01006* (2013.01); *H01L 2924/01012* (2013.01); *H01L 2924/01013* (2013.01); *H01L 2924/01023* (2013.01); *H01L 2924/01029* (2013.01); *H01L 2924/01033* (2013.01); *H01L 2924/01047* (2013.01); *H01L 2924/01079* (2013.01); *H01L 2924/01322* (2013.01); *H01L 2924/0665* (2013.01)

(56) References Cited

U.S. PATENT DOCUMENTS

2010/0102446 A1* 4/2010 Katsurayama et al. ....... 257/738
2011/0291260 A1 12/2011 Honda et al.

FOREIGN PATENT DOCUMENTS

| JP | 07-106765 A | 4/1995 |
| JP | 2001-151853 A | 6/2001 |
| JP | 2003-100953 A | 4/2003 |
| JP | 2005-116590 A | 4/2005 |
| JP | 2006-131914 A | 5/2006 |
| JP | 2006-188573 | 7/2006 |
| JP | 2006-283002 A | 10/2006 |
| JP | 2007-112956 A | 5/2007 |
| JP | 2007-224283 A | 9/2007 |
| JP | 2009-256587 | 11/2009 |
| JP | 2009-260331 A | 11/2009 |
| WO | 2006/132165 A1 | 12/2006 |
| WO | 2007/049385 A1 | 5/2007 |

* cited by examiner

SEMICONDUCTOR-ENCAPSULATING ADHESIVE, SEMICONDUCTOR-ENCAPSULATING FILM-FORM ADHESIVE, METHOD FOR PRODUCING SEMICONDUCTOR DEVICE, AND SEMICONDUCTOR DEVICE

The present application is a Divisional of U.S. patent application Ser. No. 12/838,291, filed Jul. 16, 2010, which corresponds to Japanese Application No. 2008-262100, filed Oct. 8, 2008, which was published as Japanese Application No. 2009-256587, on Nov. 5, 2009, the entire disclosures of the above applications are hereby, incorporated by reference.

The present application corresponds to Japanese Application No. 2008-262100, filed Oct. 8, 2008, which was published as Japanese Application No. 2009-256587, on Nov. 5, 2009, the entire disclosures of the above applications are hereby, incorporated by reference.

BACKGROUND OF THE INVENTION

1. Field of the Invention

The present invention relates to a semiconductor-encapsulating adhesive, a semiconductor-encapsulating film-form adhesive, a method for producing a semiconductor device, and a semiconductor device.

2. Related Background Art

Heretofore, as a method for producing a semiconductor device, the wire bonding system, which uses metal fine wire such as gold wire, has been broadly applied in order to connect semiconductor chips and substrates. On the other hand, in order to meet requirements of miniaturization, thickness reduction and high functionality for semiconductor devices, the flip chip connection systems have recently been spreading in which conductive protrusions called bumps are formed on semiconductor chips, and directly connected with substrate electrodes.

The flip chip connection systems are known to include a method in which metal bonding is carried out using a solder, tin or the like, a method in which metal bonding is carried out by applying an ultrasonic vibration, and a method in which a mechanical contact is sustained by a contraction force of a resin, but from the viewpoint of the reliability of connection portions, the method in which metal bonding is carried out using a solder or tin is common.

Particularly, in liquid crystal display modules especially whose miniaturization and high functionality have recently progressed, semiconductor devices have been used which are called COF (Chip on Film) in which liquid crystal-driving semiconductor chips having gold bumps formed thereon are mounted on polyimide substrates having tin-coated interconnects formed thereon by metal bonding using a gold-tin eutectic.

In COF, in order to form a gold-tin eutectic, the temperature of connection portions needs to be 278° C., which is a eutectic temperature thereof, or higher. Further from the viewpoint of the improvement of productivity, connection time is required to be a short time, for example, 5 seconds or less. Then, in order to heat up to a temperature equal to or higher than the eutectic temperature in a short time, the set temperature of a producing apparatus needs to be a high temperature of 300 to 450° C.

In COF, in order to protect connection portions from external environments, for an external stress in order not to concentrate on connection portions, and in order to secure the insulation reliability between narrow-pitch interconnects, a gap between a semiconductor chip and a substrate needs to be encapsulated and filled with a resin (see Japanese Patent Laid-Open No. 2006-188573). The current encapsulating and filling method is commonly one in which after a semiconductor chip and a substrate are connected, a liquid resin is injected by the capillary phenomenon and cured, but there arises an apprehension that the method needs a long time for the injection due to reduction of gaps between chips and substrates accompanying narrow-pitch connection, decreasing productivity.

A method for solving the apprehension is conceivably one in which after an adhesive is supplied to a chip or a substrate, the chip and the substrate are connected.

SUMMARY OF THE INVENTION

However, in the case where the connection of COF is carried out by this method, volatile components in an adhesive foam due to a high temperature of 300° C. or higher in connection and are likely to generate air bubbles called voids. Since the voids causes the decrease in the insulation reliability between narrow-pitch interconnects, the suppression of voids is desired.

One embodiment of the present invention is a semiconductor-encapsulating adhesive comprising (a) an epoxy resin, and (b) a compound formed of an organic acid reactive with an epoxy resin and a curing accelerator.

Use of such a semiconductor-encapsulating adhesive can suppress the generation of voids even in the case of connection at a high temperature of 300° C. or higher, and can give a produced semiconductor an excellent connection reliability. Although the reason that the use of the semiconductor-encapsulating adhesive of the embodiment provides such an effect is not altogether clear, the present inventors believe the reason as follows.

That is, an adhesive comprising (b) a compound formed of an organic acid reactive with an epoxy resin and a curing accelerator has a lower viscosity than an adhesive containing a common curing accelerator. Hence, the adhesive comprising (b) the compound can bring about good results on the securing of the initial conduction of a semiconductor device, the embeddability between narrow-pitch interconnects, and the like.

Further, since (b) a compound formed of an organic acid reactive with an epoxy resin and a curing accelerator reaches an actively reacted range in a short time in connection of bumps and interconnects, the compound exhibits a prompt curability and increases in viscosity and eliminates the void generation causes such as springback.

Further in connection, an organic acid is liberated from (b) a compound formed of the organic acid reactive with an epoxy resin and a curing accelerator, and dissolves metals (interconnections and bumps), forms conductive substances, and is degraded by heat, resulting in a risk of decreasing HAST resistance. The present inventors believe that, by contrast, use of an organic acid reactive with an epoxy resin, since the organic acid is allowed to react with an epoxy resin in a system and incorporated in the reaction system, can eliminate the problem of decreasing HAST resistance.

The semiconductor-encapsulating adhesive of the embodiment may further comprise (c) a polymeric component having a weight-average molecular weight of 10,000 or higher.

In the semiconductor-encapsulating adhesive of the embodiment, (c) the polymeric component having a weight-average molecular weight of 10,000 or higher may comprise (d) a polyimide resin, and (d) the polyimide resin may have a weight-average molecular weight of 30,000 or higher and a glass transition temperature of 100° C. or lower.

In the semiconductor-encapsulating adhesive of the embodiment, (a) an epoxy resin may be solid at 1 atm and at 25° C. (room temperature). Use of an epoxy resin being solid at room temperature can prevent the generation of volatile components (voids) due to decomposition of the epoxy resin when heated at a high temperature. For a similar reason, a compound formed of an organic acid reactive with an epoxy resin and a curing accelerator may be solid at 1 atm and at 25° C.

In the semiconductor-encapsulating adhesive of the embodiment, (b) a compound formed of an organic acid reactive with an epoxy resin and a curing accelerator may have a melting point of 120° C. or higher.

In the semiconductor-encapsulating adhesive of the embodiment, (b) a compound formed of an organic acid reactive with an epoxy resin and a curing accelerator may have an actively reacted range of 120° C. or higher. An "actively reacted range" refers to an exothermic peak temperature (a temperature giving a highest calorific value) when an epoxy resin and a curing accelerator are mixed and the temperature rises, and can be measured using, for example, a differential scanning calorimeter (DSC7, made by Perkin Elmer Inc., temperature rising rate: 10° C./minute).

In the semiconductor-encapsulating adhesive of the embodiment, the organic acid may be an acid having a carboxyl group, and may be trimesic acid.

In the semiconductor-encapsulating adhesive of the embodiment, the curing accelerator may be imidazoles.

The semiconductor-encapsulating adhesive of the embodiment may have a melt viscosity of 250 Pa·s or lower at 350° C. or higher, and a void generation rate of 5% or lower when compression bonded at 350° C. for 5 seconds or more.

Another embodiment of the present invention is a semiconductor-encapsulating film-form adhesive obtained by forming the semiconductor-encapsulating adhesive of the above-mentioned embodiment into a film-form shape. Use of such a semiconductor-encapsulating film-form adhesive, since the semiconductor-encapsulating adhesive of the above-mentioned embodiment is used, can suppress the generation of voids even in connection at a high temperature of 300° C. or higher, and can produce a semiconductor exhibiting an excellent connection reliability.

A method for producing a semiconductor device as further another embodiment of the present invention is a producing method of a semiconductor device equipped with a semiconductor chip having bumps and a substrate having metal interconnects, and comprises a connection step of arranging the semiconductor chip and the substrate such that the bumps and the metal interconnects face each other with the semiconductor-encapsulating adhesive or the semiconductor-encapsulating film-form adhesive of the embodiment interposed, and heating the semiconductor chip and the substrate while pressing them in the facing direction thereof, to cure the semiconductor-encapsulating adhesive or the semiconductor-encapsulating film-form adhesive and to electrically connect the bumps and the metal interconnects. In the connection step, the bumps and the interconnects may be electrically connected by heating the semiconductor chip and the substrate to 300° C. or higher while pressing them in the facing direction thereof to form a gold-tin eutectic between the bumps containing gold and the metal interconnects having a tin-coated layer. Such a method for producing a semiconductor device, since using the semiconductor-encapsulating adhesive or the semiconductor-encapsulating film-form adhesive, can produce a semiconductor device having excellent connection reliability.

A semiconductor device as another embodiment of the present invention can be produced by the producing method of the above-mentioned embodiment. Such a semiconductor device, since produced by the producing method of the embodiment, has excellent connection reliability.

DESCRIPTION OF THE PREFERRED EMBODIMENTS

Hereinafter, the present invention will be described in detail by way of embodiments, but the scope of the present invention is not limited thereto.

The semiconductor-encapsulating adhesive of one embodiment of the present invention comprises (a) an epoxy resin, and (b) a compound formed of an organic acid reactive with an epoxy resin and a curing accelerator. The semiconductor-encapsulating adhesive of the embodiment further comprises preferably (c) a polymeric component having a weight-average molecular weight of 10,000 or higher, more suitably (d) a polyimide resin. Hereinafter, each component will be described.

(a) The Epoxy Resin (a) The epoxy resin is not especially limited as long as having two or more epoxy groups in the molecule, and usable are, for example, various types of polyfunctional epoxy resins including bisphenol A types, bisphenol F types, naphthalene types, phenol novolac types, cresol novolac types, phenol aralkyl types, biphenyl types, triphenylmethane types and dicyclopentadiene types. These may be used singly or as a mixture of two or more.

Since, for example, bisphenol A and bisphenol F liquid epoxy resins have a 1%-thermal weight loss temperature of 250° C. or lower, there is the risk of generating volatile components due to decomposition when the resins are heated at a high temperature; therefore, an epoxy resin being solid at room temperature is desirably used.

(b) The Compound Formed of an Organic Acid Reactive with an Epoxy Resin and a Curing Accelerator (b) The compound formed of an organic acid reactive with an epoxy resin and a curing accelerator includes, for example, a salt of an organic acid reactive with an epoxy resin and a curing accelerator, and an adduct of an organic acid reactive with an epoxy resin and a curing accelerator. (b) The compound formed of an organic acid reactive with an epoxy resin and a curing accelerator is more desirably selected so that, depending on the composition of a semiconductor-encapsulating adhesive, the adhesive has a melt viscosity of 250 Pa·s or lower at 350° C. or higher, and a void generation rate of 5% or less when the adhesive is compression bonded at 350° C. for 5 seconds or more.

The organic acid may be one reactive with an epoxy resin, and usable are, for example, acids having a carboxyl group, phenols, enols, alcohols, thiols, sulfonic acids, and the like. Above all, acids having a carboxyl group are preferable; acids having a plurality of carboxyl groups are more preferable; and trimesic acid is especially preferable, from the viewpoint that these easily react particularly with an epoxy resin and these have a low influence on decrease of HAST resistance.

The curing accelerator may be one forming a salt or an adduct with an organic acid, and usable are, for example, phosphines, imidazoles and triazines.

Imidazoles include, for example, 1-cyanoethyl-2-undecylimidazole, 1-cyanoethyl-2-phenylimidazole, 2-phenylimidazole and 2-methylimidazole.

Specific examples of (b) the compound formed of an organic acid reactive with an epoxy resin and a curing accelerator includes salts such as 1-cyanoethyl-2-undecylimidazolium trimellitate and 1-cyanoethyl-2-phenylimidazolium trimellitate. A salt or an adduct of an adduct of an epoxy resin and imidazoles, and an organic acid may be used. Above all, 1-cyanoethyl-2-undecylimidazolium trimellitate and 1-cyanoethyl-2-phenylimidazolium trimellitate being salts of imidazoles and trimellitic acid are preferable from the viewpoint of the curability and preservation stability and the viewpoint that the organic acid easily react with an epoxy resin. These may be used singly or as a mixture of two or more.

Materials exhibiting enhanced latency by microcapsulation thereof may be used.

The blend amount of (b) a compound formed of an organic acid reactive with an epoxy resin and a curing accelerator in a semiconductor-encapsulating adhesive is preferably 0.1 to 10 parts by weight, more preferably 0.1 to 7 parts by weight, and still more preferably 0.1 to 5 parts by weight, with respect to 100 parts by weight of (a) an epoxy resin. With the blend amount of the (b) component of less than 0.1 part by weight, there is a risk of decreasing the curability; and with that exceeding 10 parts by weight, there is a risk where before a connection portion is formed by a gold-tin eutectic, curing has completed, generating connection faults.

(c) The Polymeric Component Having a Weight-Average Molecular Weight of 10,000 or Higher (c) The polymeric component having a weight-average molecular weight of 10,000 or higher includes, for example, epoxy resins, phenoxy resins, polyimide resins, polyamide resins, polycarbodiimide resins, phenol resins, cyanate ester resins, acrylic resins, polyester resins, polyethylene resins, polyether sulfone resins, polyetherimide resins, polyvinyl acetal resins, urethane resins and acrylic rubbers. Above all, epoxy resins, phenoxy resins, polyimide resins, cyanate ester resins, polycarbodiimide resins, acrylic rubbers and the like are preferable, and epoxy resins, phenoxy resins, polyimide resins and acrylic rubbers are more preferable, from the viewpoint that these are excellent in heat resistance and film formability. Phenol resins are also preferable from the viewpoint that the viscosity and physical properties of cured products are highly controlled. These polymeric components may be used singly, or as a mixture of two or more, or as a copolymer of two or more.

(d) The Polyimide Resin

(d) The polyimide resin can be obtained, for example, by condensation reacting a tetracarboxylic dianhydride and a diamine by a well-known method. That is, a tetracarboxylic dianhydride and a diamine in equimolar or nearly equimolar amounts (addition order of each component is optional) are addition reacted at a reaction temperature of 80° C. or lower, preferably 0 to 60° C. in an organic solvent. As the reaction progresses, the viscosity of the reaction solution gradually rises and a polyamic acid being a precursor of a polyimide is produced. In order to suppress the decrease of various characteristics of a film-form adhesive, the acid dianhydride is preferably subjected to a recrystallization refining treatment with acetic anhydride.

The molecular weight of the polyamic acid may be regulated by heating and depolymerizing it at a temperature of 50 to 80° C.

The polyimide resin can be obtained by cyclodehydrating the above-mentioned reaction product (polyamic acid). The cyclodehydration can be carried out by the thermal ring-closing method involving a heat treatment, and the chemical ring-closing method using a dehydrating agent.

The tetracarboxylic dianhydride used as a raw material of a polyimide resin is not especially limited, and includes, for example, pyromellitic dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenyl)ether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 3,3,3',4'-benzophenonetetracarboxylic dianhydride, 1,2,5,6-naphthalenetetracarboxylic dianhydride, 1,4,5,8-naphthalenetetracarboxylic dianhydride, 2,3,6,7-naphthalenetetracarboxylic dianhydride, 1,2,4,5-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,5,6-tetracarboxylic dianhydride, 2,3,3',4'-biphenyltetracarboxylic dianhydride, 3,4,3',4'-biphenyltetracarboxylic dianhydride, 2,3,2',3'-biphenyltetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylenebis(trimellitate anhydride), ethylenetetracarboxylic dianhydride, 1,2,3,4-butanetetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, 1,2,3,4-cyclobutanetetracarboxylic dianhydride, bis(exo-bicyclo[2,2,1]heptane-2,3-dicarboxylic dianhydride), bicyclo[2,2,2]-oct-7-ene-2,3,5,6-tetracarboxylic dianhydride, 2,2-bis(3,4-dicarboxyphenyl)propane dianhydride, 2,2-bis[4-(3,4-dicarboxyphenyl)phenyl]propane dianhydride, 2,2-bis(3,4-dicarboxyphenyl)hexafluoropropane dianhydride, 2,2-bis[4-(3,4-dicarboxyphenyl)phenyl]hexafluoropropane dianhydride, 4,4'-bis(3,4-dicarboxyphenoxy)diphenyl sulfide dianhydride, 1,4-bis(2-hydroxyhexafluoroisopropyl)benzene bis(trimellitic anhydride), 1,3-bis(2-hydroxyhexafluoroisopropyl)benzene bis(trimellitic anhydride), 5-(2,5-dioxotetrahydrofuryl)-3-methyl-3-cyclohexene-1,2-dicarboxylic dianhydride, tetrahydrofuran-2,3,4,5-tetracarboxylic dianhydride, tetracarboxylic dianhydrides represented by the following general formula (I):

[Chemical formula 1]

wherein n denotes an integer of 2 to 20, and
a tetracarboxylic dianhydride represented by the following formula (II):

[Chemical formula 2]

The tetracarboxylic dianhydrides represented by the general formula (I) can be synthesized, for example, from trimellitic anhydride monochloride and a corresponding diol, and specifically includes 1,2-(ethylene)bis(trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride) and 1,18-(octadecamethylene)bis(trimellitate anhydride). Above all, a tetracarboxylic dianhydride represented by the formula (II) is preferable from the viewpoint that it can impart an excellent moisture resistance reliability. These tetracarboxylic dianhydrides may be used singly or as a mixture of two or more.

The content of the tetracarboxylic dianhydride represented by the formula (II) is preferably 40 mol % or more, more preferably 50 mol % or more, and remarkably preferably 70 mol % or more, with respect to the whole of tetracarboxylic dianhydrides. The content of less than 40 mol % cannot fully secure an effect of the moisture resistance reliability based on use of the tetracarboxylic dianhydride represented by the formula (II).

The diamine used as a raw material of the polyimide resin is not especially limited, and includes, for example, aromatic diamines such as o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylmethane, bis(4-amino-3,5-dimethylphenyl)methane, bis(4-amino-3,5-diisopropylphenyl)methane, 3,3'-diaminodiphenyldifluoromethane, 3,4'-diaminodiphenyldifluoromethane, 4,4'-diaminodiphenyldifluoromethane, 3,3'-diaminodiphenyl sulfone, 3,4'-diaminodiphenyl sulfone, 4,4'-diaminodiphenyl sulfone, 3,3'-diaminodiphenyl sulfide, 3,4'-diaminodiphenyl sulfide, 4,4'-diaminodiphenyl sulfide, 3,3'-diaminodiphenyl ketone, 3,4'-diaminodiphenyl ketone, 4,4'-diaminodiphenyl ketone, 2,2-bis(3-aminophenyl)propane, 2,2'-(3,4'-diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy)benzene, 1,4-bis(3-aminophenoxy)benzene, 1,4-bis(4-aminophenoxy)benzene, 3,3'-(1,4-phenylenebis(1-methylethylidene))bisaniline, 3,4'-(1,4-phenylenebis(1-methylethylidene))bisaniline, 4,4'-(1,4-phenylenebis(1-methylethylidene))bisaniline, 2,2-bis(4-(3-aminophenoxy)phenyl)propane, 2,2-bis(4-(3-aminophenoxy)phenyl)hexafluoropropane, 2,2-bis(4-(4-aminophenoxy)phenyl)hexafluoropropane, bis(4-(3-aminophenoxy)phenyl) sulfide, bis(4-(4-aminophenoxy)phenyl) sulfide, bis(4-(3-aminophenoxy)phenyl) sulfone, bis(4-(4-aminophenoxy)phenyl) sulfone and 3,5-diaminobenzoic acid, 1,3-bis(aminomethyl)cyclohexane, 2,2-bis(4-aminophenoxyphenyl)propane, aliphatic ether diamines represented by the following general formula (III):

[Chemical formula 3]

wherein $Q^1$, $Q^2$ and $Q^3$ each independently denote an alkylene group having 1 to 10 carbon atoms; and m denotes an integer of 2 to 80,
aliphatic diamines represented by the following general formula (IV):

[Chemical formula 4]

wherein n denotes an integer of 5 to 20, and
siloxane diamines represented by the following general formula (V):

[Chemical formula 5]

wherein $Q^4$ and $Q^9$ each independently denote an alkylene group having 1 to 5 carbon atoms or a phenylene group which may have a substituent; $Q^5$, $Q^6$, $Q^7$ and $Q^8$ each independently denote an alkyl group having 1 to carbon atoms, a phenyl group or a phenoxy group; and p denotes an integer of 1 to 5.

Above all, diamines represented by the general formula (III) or (IV) shown above are preferable from the viewpoint that these can impart a low stress property, the laminatability and the adhesivity. Diamines represented by the general formula (V) shown above is preferable from the viewpoint that these can impart a low water absorbing property and a low hygroscopic property. These amines may be used singly or as a mixture of two or more. In this case, preferably, aliphatic ether diamines represented by the general formula (III) are 1 to 50 mol %; aliphatic diamines represented by the general formula (IV) are 20 to 80 mol %; and siloxane diamines represented by the general formula (V) are 20 to 80 mol %, with respect to the whole of diamines. The content out of the above-mentioned mol % region is likely to lessen the effect of imparting the laminatability and the low water absorbing property.

The aliphatic ether diamine represented by the general formula (III) shown above specifically includes:

[Chemical formula 6]

Mw = 350

Mw = 750    Mw = 1100

Mw = 2100

Mw = 230

Mw = 400

Mw = 2000

Above all, aliphatic ether diamines represented by the general formula (VI) shown below are especially preferable from the viewpoint that these can secure a low-temperature laminatability, and a good adhesivity to a substrate with organic resist.

[Chemical formula 7]

(VI)

wherein m denotes an integer of 2 to 80.

Usable aliphatic ether diamines represented by the general formula (VI) shown above includes, for example, polyoxyalkylenediamines, such as Jeffamine D-230, D-400, D-2000, D-4000, ED-600, ED-900, ED-2001 and EDR-148, made by Sun Technochemical Co., Ltd., and polyether amines D-230, D-400 and D-2000, made by BASF AG.

Aliphatic diamines represented by the general formula (IV) shown above includes, for example, 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane and 1,2-diaminocyclohexane. Above all, preferable are 1,9-diaminononane, 1,10-diaminodecane, 1,11-diaminoundecane and 1,12-diaminododecane.

Siloxane diamines represented by the general formula (V) shown above include, for example, in the case where p is 1,1,1,3,3-tetramethyl-1,3-bis(4-aminophenyl)disiloxane, 1,1,3,3-tetraphenoxy-1,3-bis(4-aminoethyl)disiloxane, 1,1, 3,3-tetraphenyl-1,3-bis(2-aminoethyl)disiloxane, 1,1,3,3-tetraphenyl-1,3-bis(3-aminopropyl)disiloxane, 1,1,3,3-tetramethyl-1,3-bis(2-aminoethyl)disiloxane, 1,1,3,3-tetramethyl-1,3-bis(3-aminopropyl)disiloxane, 1,1,3,3-tetramethyl-1,3-bis(3-aminobutyl)disiloxane and 1,3-dimethyl-1,3-dimethoxy-1,3-bis(4-aminobutyl)disiloxane, and in the case where p is 2,1,1,3,3,5,5-hexamethyl-1,5-bis(4-aminophenyl)trisiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(4-aminobutyl)trisiloxane, 1,1,5,5-tetraphenyl-3,3-dimethoxy-1,5-bis(5-aminopentyl)trisiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl)trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane and 1,1,3,3,5,5-hexapropyl-1,5-bis(3-aminopropyl)trisiloxane.

The above-mentioned polyimide resins may be used singly or optionally as a mixture (a blend) of two or more.

The glass transition temperature (Tg) of (d) the polyimide resin is desirably 100° C. or lower, and more desirably 75° C. or lower, from the viewpoint of the pastability to substrates and chips. In the case where the Tg is as high as exceeding 100° C., irregularities by bumps formed on semiconductor chips and electrodes, interconnect patterns and the like formed on substrates cannot be filled, leaving air bubbles and causing voids.

The Tg is one obtained by using DSC (differential scanning calorimetric analysis, model: DSC-7, made by Perkin Elmer Inc.) and measurement conditions of a sample amount of 10 mg, a temperature rising rate of 5° C./min, and a measurement atmosphere of air.

The weight-average molecular weight of (d) the polyimide is preferably 30,000 or higher in terms of polystyrene, more preferably 40,000 or higher, and still more preferably 50,000 or higher, in order that the polyimide alone exhibits good film formability. The weight-average molecular weight of (d) the polyimide of less than 30,000 has a risk of decreasing the film formability. The above-mentioned weight-average molecular weight refers to one obtained by using high-performance liquid chromatography (C-R4A, made by Shimadzu Corp.) and measurement in terms of polystyrene.

The content of (d) a polyimide resin in a semiconductor-encapsulating adhesive is not especially limited; but the content of (a) an epoxy resin is preferably 1 to 400 parts by weight, more preferably 10 to 400 parts by weight, and still more preferably 10 to 300 parts by weight, with respect to 100 parts by weight of (d) the polyimide resin. The content of (a) an epoxy resin of less than 1 part by weight has a risk of decreasing the curability and decreasing the adhesive force; and the content as high as exceeding 400 parts by weight has a risk of decreasing the film formability.

The semiconductor-encapsulating adhesive of the embodiment may comprise a phenol resin as a hardening agent from the viewpoint that the viscosity and the physical properties of cured products are highly controlled. The phenol resin is not especially limited as long as having two or more phenolic hydroxyl groups in the molecule, and usable are, for example, phenol novolac resins, cresol novolac resins, phenol aralkyl resins, cresol naphthol formaldehyde polycondensates, triphenylmethane type polyfunctional phenol resins, various types of polyfunctional phenol resins, and the like. These may be used singly or as a mixture of two or more.

The equivalence ratio (phenol resin/epoxy resin) of a phenol resin and (a) an epoxy resin in the case of blending a phenol resin is preferably 0.3 to 1.5, more preferably 0.4 to 1.2, and still more preferably 0.5 to 1.0, from the viewpoint of the curability, adhesivity, preservation stability and the like. The equivalent ratio of less than 0.3 has a risk of decreasing the curability and decreasing the adhesive force; and that exceeding 1.5 has a risk of excessively leaving unreacted phenolic hydroxide groups, raising the water absorption, and decreasing the insulation reliability.

The semiconductor-encapsulating adhesive of the embodiment may be blended with a filler in order to control the viscosity and physical properties of cured products. The filler usable is insulating inorganic fillers, whiskers and resin fillers. The insulating inorganic filler includes, for example, glass, silica, alumina, titanium oxide, carbon black, mica and boron nitride. Above all, preferable are silica, alumina, titanium oxide and boron nitride, and more preferable are silica, alumina and boron nitride. The whisker includes aluminum borate, aluminum titanate, zinc oxide, calcium silicate, magnesium sulfate and boron nitride. The resin filler usable is polyurethane resins, polyimide resins and the like. These fillers and whiskers may be used singly or as a mixture of two or more. The shape, the particle diameter and the blend amount of a filler are not especially limited.

The semiconductor-encapsulating adhesive of the embodiment may be blended further with a silane coupling agent, a titanium coupling agent, a leveling agent, an antioxidant and an ion trapping agent. These may be used singly or as a mixture of two or more. The blend amount may be regulated so that effects of each additive are developed.

The void generation rate in the semiconductor-encapsulating adhesive of the embodiment is preferably 5% or less, more preferably 3% or less, and still more preferably 1% or less. The void generation rate as high as exceeding 5% has a risk of leaving voids between narrow-pitch interconnects, and decreasing the insulation reliability. The void generation rate can be measured by a method to be described in Examples or other methods.

The above-mentioned semiconductor-encapsulating adhesive can be used suitably for manufacture of COF.

The method for fabricating the semiconductor-encapsulating adhesive (semiconductor-encapsulating film-form adhesive) of the embodiment will be described hereinafter.

The above-mentioned components are added to an organic solvent, and dissolved or dispersed by stirring mixing, kneading or otherwise to prepare a resin vanish. Thereafter, the resin vanish is applied on a substrate film having been subjected to a release treatment by using a knife coater, a roll coater or an applicator; and thereafter, the organic solvent is removed by heating to form a film-form adhesive on the substrate film.

When a resin vanish is prepared, organic solvent used in (d) a polyimide resin synthesis may be used without being removed, and other components are added thereto to prepare the resin vanish.

The organic solvent used in preparation of a resin vanish is preferably one having a property capable of homogeneously dissolving or dispersing each component, and includes, for example, dimethylformamide, dimethylacetamide, N-methyl-2-pyrrolidone, dimethyl sulfoxide, diethylene glycol dimethyl ether, toluene, benzene, xylene, methyl ethyl ketone, tetrahydrofuran, ethyl cellosolve, ethyl cellosolve acetate, butyl cellosolve, dioxane, cyclohexanone and ethyl acetate. These organic solvents may be used singly or as a mixture of two or more. Mixing and kneading in preparation of a resin vanish can be carried out using a stirrer, a grinder, a triple roll mill, a ball mill, a Homo Disper, or the like.

The substrate film is not especially limited as long as having a heat resistance withstanding a heating condition when an organic solvent is volatilized, and exemplified by polyester film, polypropylene film, polyethylene terephthalate film, polyimide film, polyether imide film, polyether naphthalate film and methylpentene film. The substrate film is not limited to a monolayer film composed of the one film, and may be a multilayer film composed of two or more materials.

The condition when an organic solvent is volatilized from a resin vanish after application is preferably a condition of fully volatilizing the organic solvent, and specifically, heating is preferably carried out at 50 to 200° C. for 0.1 to 90 minutes.

A method for producing the semiconductor device of the embodiment will be described hereinafter.

The producing method of the semiconductor device of the embodiment comprises a connection step of connecting a semiconductor chip and a substrate having metal interconnects at a temperature of 300° C. or higher with the above-mentioned semiconductor-encapsulating film-form adhesive interposed.

The material of bumps formed on a semiconductor chip includes, for example, gold, a low-melting solder, a high-melting solder, nickel and tin. Above all, gold is suitable in the case of the application to COF.

The material of a substrate includes, for example, inorganic materials such as ceramics, and organic materials such as epoxy resins, bismaleimide triazine resins and polyimide resins. Above all, polyimide resins are suitable in the case of the application to COF.

The material to form interconnects of a substrate includes, for example, copper, aluminum, silver, gold and nickel. Interconnects are formed by etching or pattern plating. The surface of interconnects may be subjected to a plating treatment with gold, nickel, tin or the like. Above all, copper interconnects having a tin-coated surface are suitable in the case of the application to COF.

A semiconductor-encapsulating film-form adhesive may be cut out in a predetermined size, and then pasted on a substrate; or a semiconductor chip with a semiconductor-encapsulating film-form adhesive pasted thereon may be fabricated by pasting the semiconductor-encapsulating film-form adhesive on the bump forming surface of a semiconductor wafer, and then dicing the wafer into pieces.

The area and the thickness of a film-form adhesive are suitably set depending on the size of a semiconductor chip and the height of bumps.

After a semiconductor-encapsulating film-form adhesive is pasted on a substrate or a semiconductor chip, an interconnect pattern of the substrate and bumps of the semiconductor chip are aligned; and a pressure is applied at a temperature of 300 to 450° C. for 0.5 to 5 seconds. Thereby, the substrate and the semiconductor chip are connected and gaps between the semiconductor chip and the substrate are encapsulated and filled with the adhesive.

The connection load depends on the number of bumps and other factors, but is established in consideration of the absorption of the variation in bump heights and the control of the amount of bump deformation. A heat treatment may be carried out in an oven or the like after a semiconductor chip and a substrate are connected.

Semiconductor devices produced by the above-mentioned producing method can be suitably used, for example, for liquid crystal modules and the like.

EXAMPLES

Hereinafter, one embodiment of the present invention will be described specifically by way of Examples, but the scope of the present invention is not limited to Examples.

(Synthesis of a Polyimide Resin)

In a 300-ml flask equipped with a thermometer, a stirrer, and a calcium chloride tube, 2.10 g (0.035 mol) of 1,12-diaminododecane, 17.31 g (0.03 mol) of a polyether diamine (ED2000, made by BASF AG, <weight average molecular weight: 1923>), 2.61 g (0.035 mol) of 1,3-bis(3-aminopropyl)tetramethyldisiloxane (LP-7100, made by Shin-Etsu Chemical Co., Ltd.) and 150 g of N-methyl-2-pyrrolidone (made by Kanto Chemical Co., Inc.) were charged and stirred. After the diamine was dissolved, 15.62 g (0.10 mol) of 4,4'-(4,4'-isopropylidenediphenoxy)bis(phthalic dianhydride) (BPADA, made by Sigma-Aldrich Corp.) having been recrystallization refined with acetic anhydride was added little by little while the flask was being cooled in an ice bath. After the solution was allowed to react at room temperature (25° C.) for 8 hours, 100 g of xylene was added; and the solution was heated at 180° C. while nitrogen gas was being blown in to azeotropically remove water and together xylene, to obtain a polyimide resin (Tg: 22° C., weight-average molecular weight: 47,000, SP value: 10.2; hereinafter, referred to as "synthesized polyimide").

(A Method for Fabricating a Film-Form Adhesive)

(1) 1.62 g of the above-mentioned synthesized polyimide, 0.18 g of an epoxy resin: YDCN-702, 0.18 g of an epoxy resin: VG3101L, 0.11 g of a silica filler: R972, 0.70 g of boron nitride: HPP1-HJ, 0.0036 g of a curing accelerator, and 4.4 g of N-methyl-2-pyrrolidone (made by Kanto Chemical Co., Inc.) were charged in a 20-ml glass screw tube, and stirred by a stirring, defoaming apparatus AR-250 (made by Thinky Corp.). After the deformation, the solution was coated by a coating machine PI1210FILMCOATER (made by Tester Sangyo Co., Ltd.), and dried at 80° C. for 30 minutes and 120° C. for 30 minutes in a clean oven (made by Espec Corp.), to obtain a film-form adhesive.

(2) 1.62 g of the above-mentioned synthesized polyimide, 0.36 g of an epoxy resin 1032H60, 0.15 g of silica filler, 0.0036 g of a curing accelerator, and NMP in an amount so that the entire solid content becomes 40% were charged in a 20-ml glass screw tube, and stirred by a stirring, defoaming apparatus AR-250 (made by Thinky Corp.). After the deformation, the solution was coated by a coating machine PI1210FILM COATER (made by Tester Sangyo Co., Ltd.), and dried at 80° C. for 30 minutes and 120° C. for 30 minutes in a clean oven (made by Espec Corp.), to obtain a film-form adhesive.

(Synthesis of a Compound Formed of an Organic Acid Reactive with an Epoxy Resin and a Curing Accelerator)

Trimesic acid was added into methyl ethyl ketone (Kanto Chemical Co., Inc., hereinafter referred to as "MEK"), stirred at 60° C. and dissolved to obtain MEK solution (nonvolatile portion: 3 mass %) of trimesic acid. Therein MEK solution (nonvolatile portion: 3 mass %) of 1-cyanoethyl-2-phenylimidazole (2PZ-CN) was dropped. The mol ratio of trimesic acid and 2PZ-CN was 1:1. After the drop, the solution was stirred for 30 minutes. Generated precipitate was removed by filtration, dried at 80° C. for 30 minutes in a clean oven, to obtain adduct (white solid substance). A synthesized adduct is hereinafter referred to as "Synthesized curing accelerator 1."

Also, an adduct (white solid substance) synthesized by the above similar method using trimellitic acid in place of trimesic acid is hereinafter referred to as "Synthesized curing accelerator 2."

Examples 1 and 2, Comparative Examples 1 to 4, and Experimental Examples 1 to 3

Film-form adhesives were fabricated by the same method as that for the above-mentioned film-form adhesive, except for altering to compositions of materials used shown in Table 1.

Compounds used in Examples, Comparative Examples and Experimental Examples are as follows.

(a) Epoxy Resins

A cresol novolac epoxy resin (YDCN-702, made by Tohto Kasei Co., Ltd.)

A polyfunctional special epoxy resin (VG3101L, made by Printec Corporation)

Triphenolmethane polyfunctional solid epoxy resin (Japan Epoxy Resins Co., Ltd., EP1032H60)

(b) Compounds Formed of an Organic Acid Reactive with an Epoxy Resin and a Curing Accelerator 1-cyanoethyl-2-phenylimidazolium trimellitate (2PZ-CNS, made by Shikoku Chemicals Corp.)

1-cyanoethyl-2-undecylimidazolium trimellitate (C11Z-CNS, made by Shikoku Chemicals Corp.)

Synthesized curing accelerator 1

Synthesized curing accelerator 2

(b') Curing Accelerators 1-cyanoethyl-2-phenylimidazole (2PZ-CN, made by Shikoku Chemicals Corp.)

2,4-diamino-6-[2'-methylimidazolyl-(1')]-ethyl-s-triazine (2MZA-PW, made by Shikoku Chemicals Corp.)

(b") An Adduct of an Organic Acid and a Curing Accelerator 2,4-diamino-6-[2'-methylimidazolyl-(1')]-ethyl-s-triazine isocyanuric acid adduct (2MAOK-PW, made by Shikoku Chemicals Corp.)

(d) A Polyimide Resin

The above-mentioned synthesized polyimide (e) Other Components

A phenol resin: a cresol naphthol formaldehyde polycondensate (Kayahard NHN, made by Nippon Kayaku Co., Ltd.)

Fillers:

Boron nitride (HPP1-HJ<average particle diameter: 1.0 μm, maximum particle diameter: 5.1 μm>, made by Mizushima Ferroalloy Co., Ltd.)

Silica filler (R972<average particle diameter: 20 nm>, made by Nippon Aerosil Co., Ltd.)

Silica filler (SE5050<average particle diameter: 1.5 μm>, made by Admatechs Co., Ltd.)
Carboxylic Acid:
Trimesic acid (made by Tokyo Chemical Industry, Co., Ltd.)
Trimellitic acid (made by Tokyo Chemical Industry, Co., Ltd.)

(Evaluation of the Film-Form Adhesives)

The film-form adhesives obtained in Examples 1 and 2 and Comparative Examples 1 to 4 were measured for viscosity, void generation rate, connection resistance and HAST resistance by methods described hereinafter. The results are shown in Table 1.

(1) Measurement of the Viscosity

Figure 1:
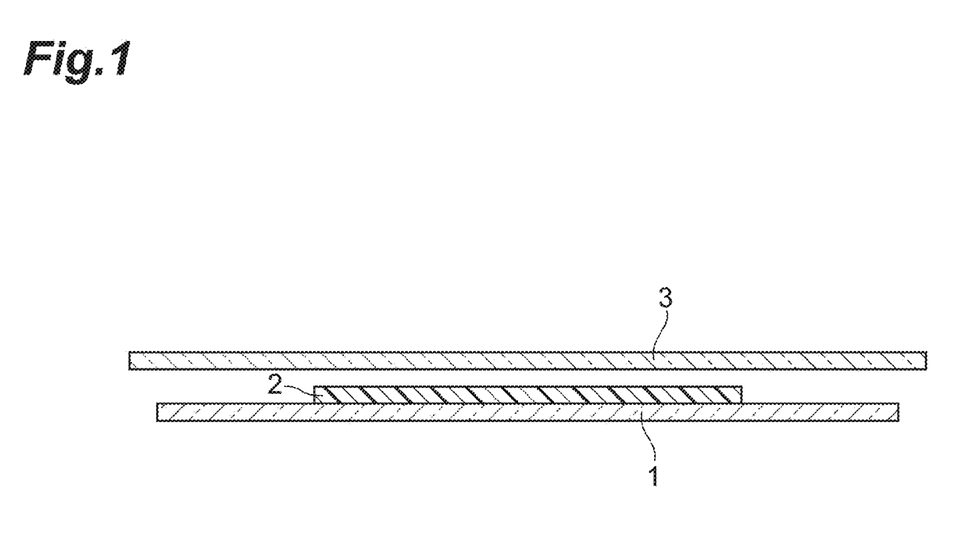
FIG. 1 is an illustrative sectional diagram of a sample A used in measurement of the viscosity.

A glass chip 1, a film-form adhesive 2 and a cover glass 3 shown in FIG. 1 were laminated in this order to fabricate a sample A. Specifically, the fabricated film-form adhesive was cut out (into a diameter of 6 mm and a thickness of about 0.1 mm), pasted on a glass chip (15 mm×15 mm×0.7 mm thick), and covered with a cover glass (18 mm×18 mm×0.12 to 0.17 mm thick) to fabricate a sample A. The sample A was compression bonded (compression bond condition: 350° C., 0.5 second, and 1 MPa) by an FCB3 (a Flip Chip Bonder, made by Matsushita Electric Industrial Co., Ltd.); and the volume change of the film-form adhesive before and after the compression bonding was measured. The viscosity was calculated by the expression shown below from a volume change by the parallel-plate Plastometer method.

(the Expression for Calculating a Viscosity by the Parallel-Plate Plastometer Method)

$$\mu = 8\pi F t Z^4 Z_0^4 / 3 V^2 (Z_0^4 - Z^4)$$

μ: viscosity (Pa·s)
F: load (N)
t: pressurizing time (s)
$Z_0$: initial thickness (m)
Z: thickness after pressurization (m)
V: resin volume (m$^3$)

For the film-form adhesives in Example 1 and Comparative Examples 2 to 4, the viscosity changes in the case of altering the compression bond time to 0.5, 1 and 5 seconds, respectively, were measured. The results are shown in Table 2.

(2) Measurement of the Void Generation Rate

Figure 2:
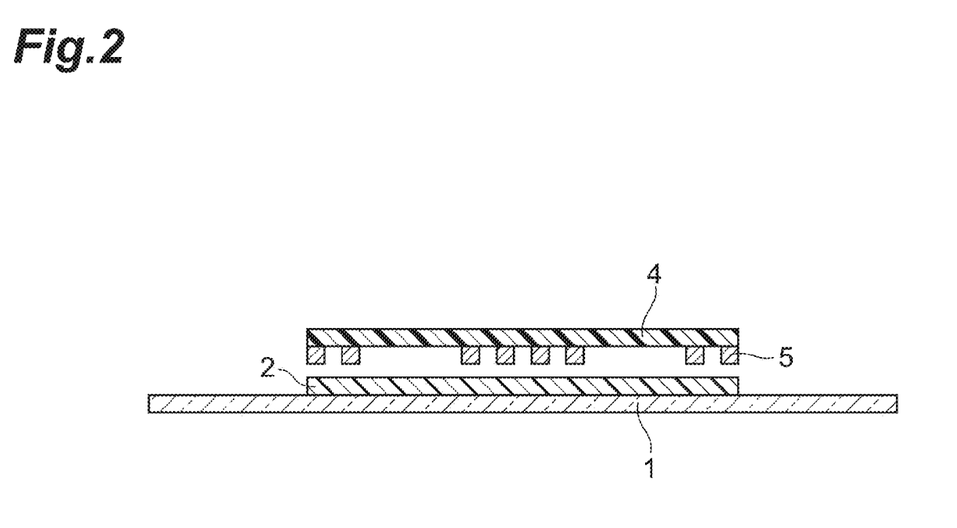
FIG. 2 is an illustrative sectional diagram of a sample B used in measurement of the void generation rate.

A glass chip 1, a film-form adhesive 2 and a chip 4 with gold bumps 5 shown in FIG. 2 were laminated in this order to fabricate a sample B. Specifically, the fabricated film-form adhesive was cut out (into 5 mm×5 mm×0.03 mm thick), pasted on a glass chip (15 mm×15 mm×0.7 mm thick), and covered with a chip with gold bumps (1) (4.26 mm×4.26 mm×0.27 thick, a bump height of 0.02 mm) to fabricate a sample B. The sample B was compression bonded (compression bond condition: a head temperature of 350° C., a stage temperature of 100° C., 5 seconds, and 1 MPa) by an FCB3 (a Flip Chip Bonder); and the void generation rates before and after the compression bonding were measured. The void generation rate was calculated as a ratio of a generated void area after the pressurization per area of the chip with gold bumps (1).

(3) Production of a Semiconductor Device (Evaluation of the Connection Resistance)

The fabricated film-form adhesive was cut out (into 2.5 mm×15.5 mm×0.03 mm thick), and pasted on a polyimide substrate (JKITCOF TEG__30-B, polyimide substrate material: 38 μm thick, copper interconnects: 8 μm thick, interconnect tin plate: 0.2 μm thick, made by Hitachi ULSI Systems Co., Ltd.); and a chip with gold bumps (2) (JTEG PHASE6__ 30, chip size: 1.6 mm×15.1 mm×0.4 mm thick, bump size: 20 μm×100 μm×15 μM high, the numbers of bumps: 726, made by Hitachi ULSI Systems Co., Ltd.) was mounted thereon by an FCB3 (mounting condition: a head temperature of 350° C., a stage temperature of 100° C., 1 second, and 50 N).

Figure 3:
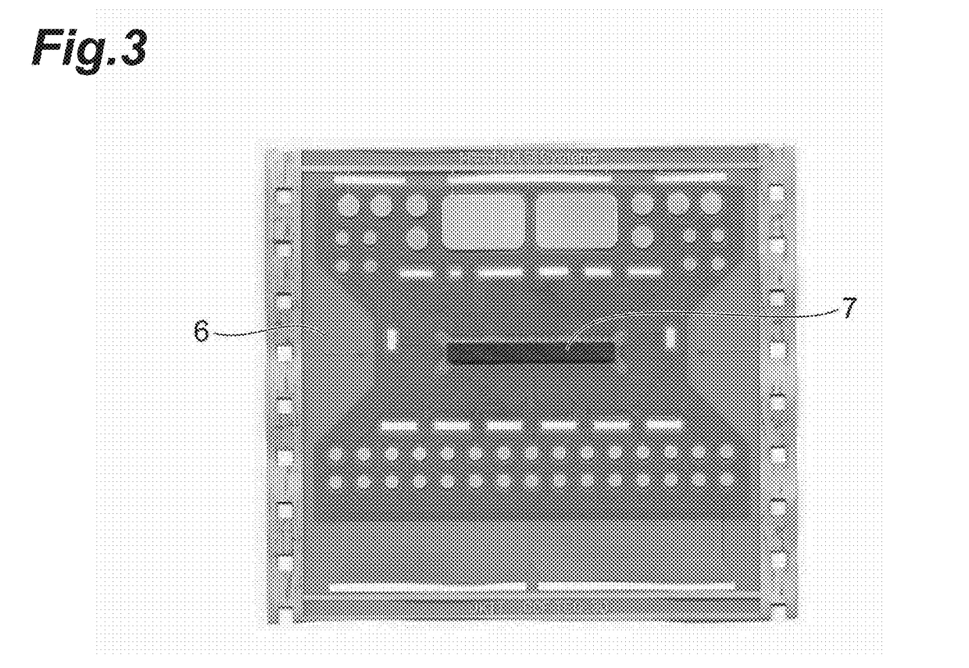
FIG. 3 is a photograph showing the whole of a semiconductor device produced in production of the semiconductor device.
Figure 4:
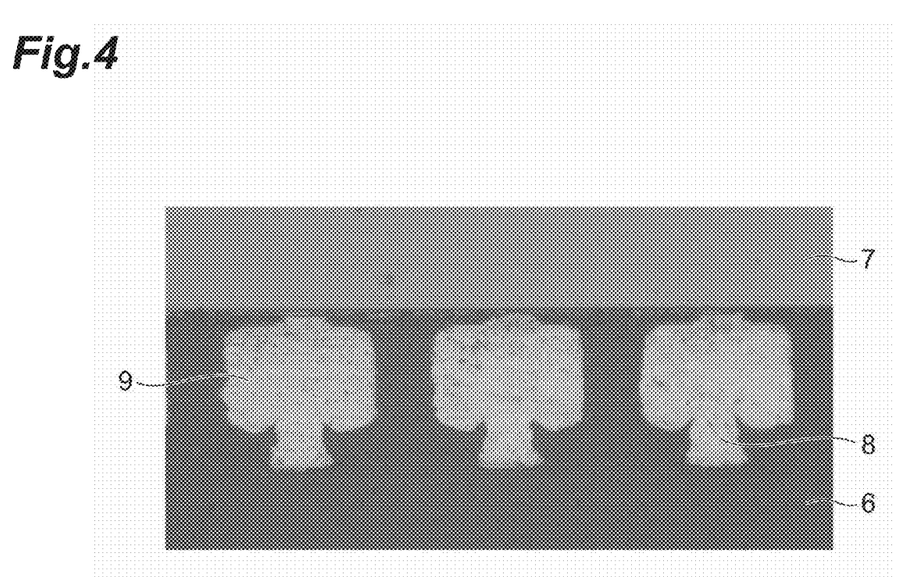
FIG. 4 is a photograph showing a cross section of a semiconductor device produced in production of the semiconductor device.

FIG. 3 is a photograph showing the whole of a produced semiconductor device, and FIG. 4 is a photograph showing a cross section of the semiconductor device. In the figures, reference numerals 6, 7, 8 and 9 are the polyimide substrate, the chip (2), the tin-coated copper interconnects, the gold bumps (2), respectively.

The semiconductor device (no film-form adhesive) obtained by mounting the chip with gold bumps (2) on the polyimide substrate (daisy chain connection) by the FCB3 had a connection resistance value of about 160(Ω), so the case where the connection resistance value was less than 200(Ω) was rated as "A", and the case where the connection resistance value was 200(Ω) or more was rated as "B", (4) The Insulation Reliability Test (HAST Test: Highly Accelerated Storage Test)

Figure 5:
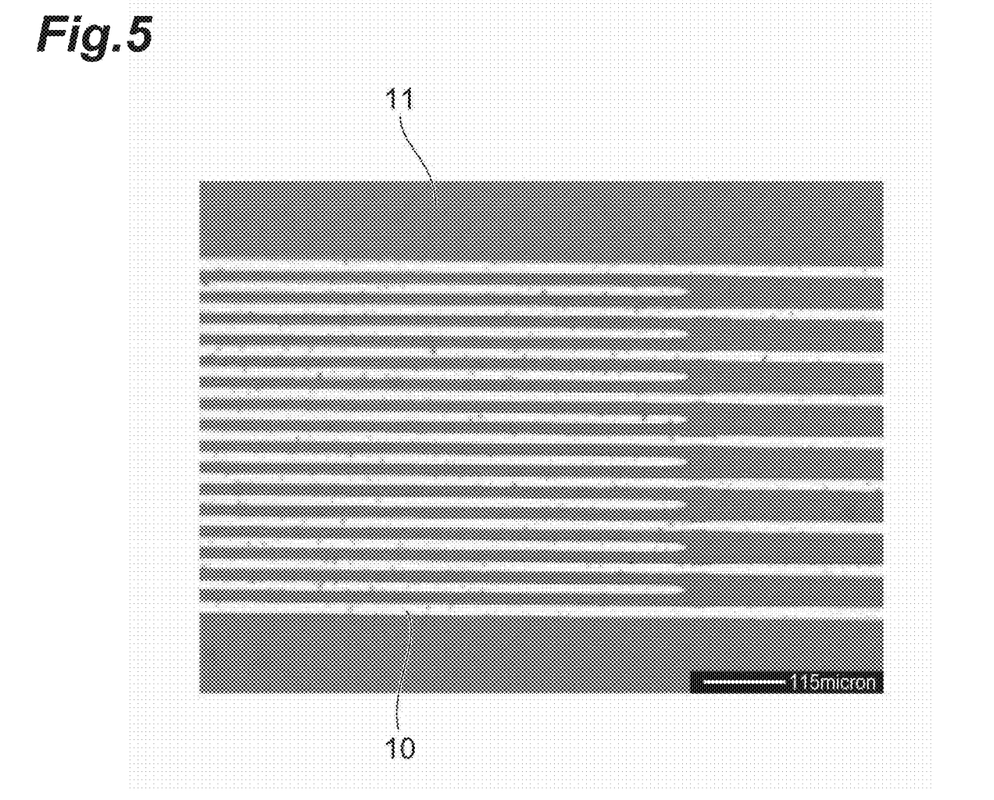
FIG. 5 is a photograph showing a general view of a sample C used in an insulation reliability test.

The film-form adhesive was laminated on a polyimide substrate 11 having comb-shaped tin-coated copper interconnects 10 formed thereon as shown in FIG. 5 to fabricate a sample C. Specifically, the fabricated film-form adhesive (thickness: 30 μm) was pasted on a comb-shaped electrode evaluation TEG (30 μm-pitch), in which tin-coated interconnects are formed on a polyimide film, and cured (at 180° C. for 1 hour) in a clean oven (made by Espec Corp.) to fabricate a sample C. After the curing, the sample C was taken out, put in an accelerated life tester (PL-422R8, made by Hirayama Manufacturing Corp., conditions: 110° C., 85%, 100 hours), and measured for the insulation resistance.

During the measurement, the case where the insulation resistance was $10^7 \Omega$ or higher was rated as "A", and the case where the insulation resistance was less than $10^7 \Omega$ was rated as "B".

TABLE 1

| Items | Blending Materials | Example 1 | Example 2 | Comparative Example 1 | Comparative Example 2 | Comparative Example 3 | Comparative Example 4 |
|---|---|---|---|---|---|---|---|
| Polyimide Resin | Synthesized polyimide | 100 | 100 | 100 | 100 | 100 | 100 |
| Epoxy Resin | YDCN-702 | 11 | 11 | 11 | 11 | 11 | 11 |
|  | VG3101L | 11 | 11 | 11 | 11 | 11 | 11 |
| Phenol Resin | Kayahard NHN | 8 | 8 | 8 | 8 | 8 | 8 |
| Filler | HPP1-HJ | 43 | 43 | 43 | 43 | 43 | 43 |
|  | R972 | 7 | 7 | 7 | 7 | 7 | 7 |
| Curing Accelerator | 2PZ-CNS | 0.2 |  |  |  |  |  |
|  | C11Z-CNS |  | 0.2 |  |  |  |  |
|  | 2PZ-CN |  |  |  | 0.2 |  |  |

TABLE 1-continued

|  | Blending | Example | | Comparative Example | | | |
|---|---|---|---|---|---|---|---|
| Items | Materials | 1 | 2 | 1 | 2 | 3 | 4 |
|  | 2MAOK |  |  |  |  | 0.2 |  |
|  | 2MZA |  |  |  |  |  | 0.2 |
|  | Evaluation Results | | | | | | |
| Viscosity (Pa · s) |  | 250 or less | 250 or less | 250 or less | 30000 | 250 or less | 4000 |
| Connection Resistance |  | A | A | A | B | A | B |
| Void Generation Rate (%) |  | 0.01 | 0.01 | 7 | 0.01 | 0.1 | 0.01 |
| HAST Resistance |  | A | A | A | A | B | A |

TABLE 2

| Items | 0.5 s | 1 s | 5 s |
|---|---|---|---|
| Example 1 (2PZ-CNS) | 100 | 120 | 400 |
| Comparative Example 2 (2PZ-CN) | 30000 | 31200 | 90000 |
| Comparative Example 3 (2MAOK) | 100 | 150 | 500 |
| Comparative Example 4 (2MZA) | 4000 | 5700 | 25800 |

The (b) component (curing accelerator) in Example 1 was a salt of a curing accelerator in Comparative Example 2 and an organic acid reactive with an epoxy resin; and the curing accelerator in Comparative Example 3 was an adduct of a curing accelerator in Comparative Example 4 and an organic acid not reactive with an epoxy resin.

In Examples 1 and 2, addition of the (b) component caused the void generation rate to be reduced vigorously more than in Comparative Example 1. Examples 1 and 2 and Comparative Example 3, which used a compound formed of an organic acid and a curing accelerator, and Comparative Example 1, which used no curing accelerator, had a viscosity of 250 Pa·s or lower, had a sufficiently low connection resistance, securing a conduction.

Comparing Example 1 and Comparative Example 2 in Table 2, it is clear that the film-form adhesive in Example 1 exhibited a sufficiently low viscosity increase even after the solvent drying (at 80° C. for 30 minutes and at 120° C. for 30 minutes). Comparing with the case of using no curing accelerator (Comparative Example 1), since the film-form adhesives in examples 1 and 2 exhibited a vigorously reduced void generation rate, it is clear that the (b) components in Examples 1 and 2 exhibited an activity even at 120° C. or higher. Comparing with Comparative Example 3, it is clear that the film-form adhesives in Examples 1 and 2 had a good HAST resistance.

By using the Experimental Examples 1-3, the evaluation results for other curing systems are shown. The mounting condition in Table 3, the head temperature was altered from 350° C. to 450° C. Others were the same with the above evaluation conditions.

TABLE 3

|  | Blending | Experimental Example | | |
|---|---|---|---|---|
| Items | Materials | 1 | 2 | 3 |
| Polyimide Resin | Synthesized polyimide | 100 | 100 | 100 |
| Epoxy Resin | 1032H60 | 22 | 22 | 22 |
| Filler | SE5050 | 9.3 | 9.3 | 9.3 |
| Curing Accelerator | Synthesized curing accelerator 1 | 0.2 |  |  |
|  | Synthesized curing accelerator 2 |  | 0.2 |  |
|  | 2PZ-CNS |  |  | 0.2 |
|  | Evaluation Results | | | |
| Viscosity (Pa × s) |  | 250 or less | 250 or less | 250 or less |
| Connection Resistance |  | A | A | A |
| Void Generation Rate (%) |  | 0.01 | 0.5 | 0.5 |
| HAST Resistance |  | A | A | A |

From the Experimental Examples 1 and 2, no difference in the evaluation results on commercial item and the synthesized items was found. Further, comparing to the synthesized curing accelerator 2 which used trimellitic acid, the film-form adhesives in which the synthesized curing accelerator 1 which used trimesic acid was added, rather had decreased void.

What is claimed is:

1. A method for producing a semiconductor device equipped with a semiconductor chip having a bump and a substrate having a metal interconnect, comprising a connection step of:
   (1) arranging the semiconductor chip and the substrate such that the bump and the metal interconnect face each other with a semiconductor-encapsulating adhesive interposed therebetween, the semiconductor-encapsulating adhesive comprising
      (a) an epoxy resin, and
      (b) a compound formed of an organic acid reactive with an epoxy resin and a curing accelerator, wherein the compound is formed prior to use in the semiconductor-encapsulating adhesive; and
   (2) heating the semiconductor chip and the substrate while pressing the semiconductor chip and the substrate in the facing direction thereof, to cure the semiconductor-encapsulating adhesive and to electrically connect the bump and the metal interconnect.

2. The method of claim 1, wherein the semiconductor-encapsulating adhesive comprises (c) a polymeric component having a weight-average molecular weight of 10,000 or more.

3. The method of claim 1, wherein (a) the epoxy resin is solid at 1 atm and at 25° C.

4. The method of claim 1, wherein (b) the compound formed of an organic acid reactive with an epoxy resin and a curing accelerator is solid at 1 atm and at 25° C.

5. The method of claim 1, wherein (b) the compound formed of an organic acid reactive with an epoxy resin and a curing accelerator has a melting point of 120° C. or higher.

6. The method of claim 1, wherein (b) the compound formed of an organic acid reactive with an epoxy resin and a curing accelerator has an actively reacted range of 120° C. or higher.

7. The method of claim 1, wherein the organic acid is an acid having a carboxyl group.

8. The method of claim 1, wherein the curing accelerator is an imidazole.

9. The method of claim 1, wherein the organic acid is trimesic acid.

10. The method of claim 1, wherein the semiconductor-encapsulating adhesive has a melt viscosity of 250 Pa·s or lower at 350° C. or higher, and a void generation rate of 5% or less when the semiconductor-encapsulating adhesive is compression bonded at 350° C. for 5 seconds or more.

11. The method of claim 1, wherein the semiconductor-encapsulating adhesive is a film-form adhesive.

* * * * *